(12) United States Patent
Kirichenko

(10) Patent No.: US 7,786,786 B2
(45) Date of Patent: Aug. 31, 2010

(54) MULTIPHASE CLOCK FOR SUPERCONDUCTING ELECTRONICS

(75) Inventor: Dmitri Kirichenko, Yorktown Heights, NY (US)

(73) Assignee: Hypres, Inc., Elmsford, NY (US)

( * ) Notice: Subject to any disclaimer, the term of this patent is extended or adjusted under 35 U.S.C. 154(b) by 0 days.

(21) Appl. No.: 12/316,872

(22) Filed: Dec. 17, 2008

(65) Prior Publication Data
US 2010/0148841 A1 Jun. 17, 2010

(51) Int. Cl.
*G06F 1/04* (2006.01)
(52) U.S. Cl. .................. 327/295; 327/299; 327/241; 327/242
(58) Field of Classification Search ............. 377/47–49; 327/113–122, 142, 144, 145, 238, 239, 240–242, 327/291–295, 298–299
See application file for complete search history.

(56) References Cited

U.S. PATENT DOCUMENTS

| | | | | |
|---|---|---|---|---|
| 5,365,119 A | * | 11/1994 | Kivari | ........................ 327/115 |
| 7,224,235 B2 | * | 5/2007 | De Ranter et al. | ............. 331/34 |
| 7,554,369 B2 | * | 6/2009 | Kirichenko | .................. 327/117 |
| 2008/0231353 A1 | * | 9/2008 | Filippov et al. | ............. 327/551 |
| 2008/0238559 A1 | * | 10/2008 | Kuwano | ..................... 331/109 |
| 2009/0073017 A1 | * | 3/2009 | Kim et al. | .................... 341/155 |

* cited by examiner

*Primary Examiner*—An T Luu
(74) *Attorney, Agent, or Firm*—Henry I. Schanzer, Esq (57) ABSTRACT

A multiphase clock circuit in which bit errors are propagated only for the duration of the clock cycle in which a bit error occurs. The circuit recovers automatically from bit errors and is capable of operating at high frequency with high clock precision. The multiphase clock circuit can generate a plurality of clock pulse streams, each pulse stream at the same clock frequency, with fixed phase relationships among the streams. The multiphase clock circuit includes a master clock signal of frequency fc which is applied to a divide by N frequency divider circuit for producing a base clock signal of fc/N. The base clock signal is sequentially applied to the data input of a series chain of N clocked data flip-flops (DFFs) each of which is simultaneously clocked by a clock signal of frequency fc to produce N clock signals of base frequency fc/N separated from each other by a constant time delay T=1/fc.

21 Claims, 10 Drawing Sheets

Fig. 1. Prior Art Multiphase Clock

Fig. 1C. Prior Art Multiphase Clock with Propagation of Errors

Fig. 2. New Multiphase Clock

Fig. 2B. Schematic of DFF

Fig. 3. Timing Diagram of New Multiphase Clock with Errors Clocked out of System

Fig. 4. Some alternative frequency dividers

Fig. 5. Equal-delay clock splitter network

Fig. 6. Digital IQ Mixer Circuit with Prior Art 4-Phase Clock/LO

Fig. 7. Digital IQ Mixer Circuit with New 4-Phase Clock/LO

Fig. 8. Block Diagram of 4-bit Serializer with New 4-Phase Clock

MULTIPHASE CLOCK FOR SUPERCONDUCTING ELECTRONICS

BACKGROUND OF THE INVENTION

This invention relates to multi-phase clock circuitry and, in particular, to an improved multiphase clock circuit in which the generation and propagation of clock pulse errors is contained and which clock circuit is highly suitable for use in combination with circuits (e.g., digital IQ mixer circuits) requiring multiphase clocks.

A clock signal in a digital circuit may consist of a periodic time series of pulses, at frequency $f_{clock}$. In many digital circuits, two or more clock signals are required having the same frequencies but different phases. This can be obtained by shifting the pulses in a given clock signal relative to those in other clock signals by a fixed fraction of a clock period $T=1/f_{clock}$. For example, if there are 4 clock signals of like frequency, the clocks are delayed relative to each other by T/4. That is, clock #2 is delayed from clock #1 by T/4, clock #3 is delayed from clock #2 by T/4, and clock #4 is delayed from clock #3 by T/4. These clock signals are typically identified in terms of phase delays, where a time T corresponds to a full clock cycle and a phase delay of 360 degrees. For a 4-phase clock, if clock #1 is defined as 0 degrees, clock #2 is 90 degrees, clock #3 is 180 degrees, and clock #4 is 270 degrees. The discussion above and to follow refers to a 4-phase clock; however, the number of phases of a multiphase clock may be equal to any number equal to, or greater than, 2.

Precision clocks are particularly critical for ultrafast superconducting circuits based on damped Josephson junctions, according to a logic family known as rapid-single-flux-quantum (RSFQ) logic. See, for example, U.S. Pat. No. 6,331,805, "On-chip long Josephson junction clock technology". Simple RSFQ digital circuits such as a binary frequency divider (using toggle-flip-flops or TFFs) have been demonstrated at frequencies of several hundred gigahertz, faster than any other digital technology. More complex RSFQ digital integrated circuits have been operated at clock rates of 40 GHz or above.

Figure 1A:
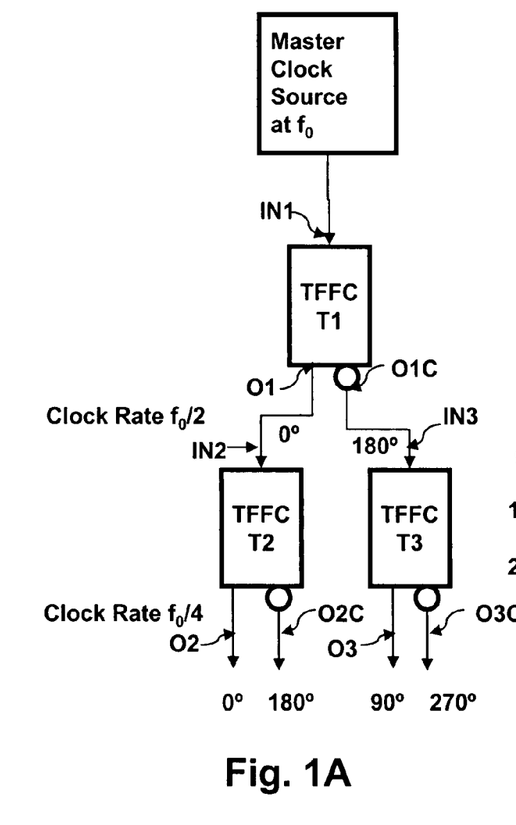
FIG. 1A is a block diagram of a prior art multiphase clock circuit.

Recently, a digital mixer circuit using a 4-phase clock of the type shown in FIG. 1A was demonstrated using RSFQ circuits, see U.S. patent application Ser. No. 11/243,019, publication #20070077906. FIG. 1A depicts a prior art multiphase clock circuit made up of a binary tree (divider circuit) using standard asynchronous RSFQ toggle-flip-flops with complementary output (TFFC cells). These cells can be interconnected to generate a clock with $2^N$ equally-spaced phases, where N is the number of levels in the binary tree, and can be any number equal to or greater than one. In FIG. 1A, two (2) logic levels are shown; T1 forms the first logic level and T2 and T3 form the second logic level at which is produced four (4) clock outputs spaced 90 degrees apart from each other. Thus, FIG. 1A is a block diagram of a 2-stage prior art circuit that generates a 4-phase clock.

Figure 1B:
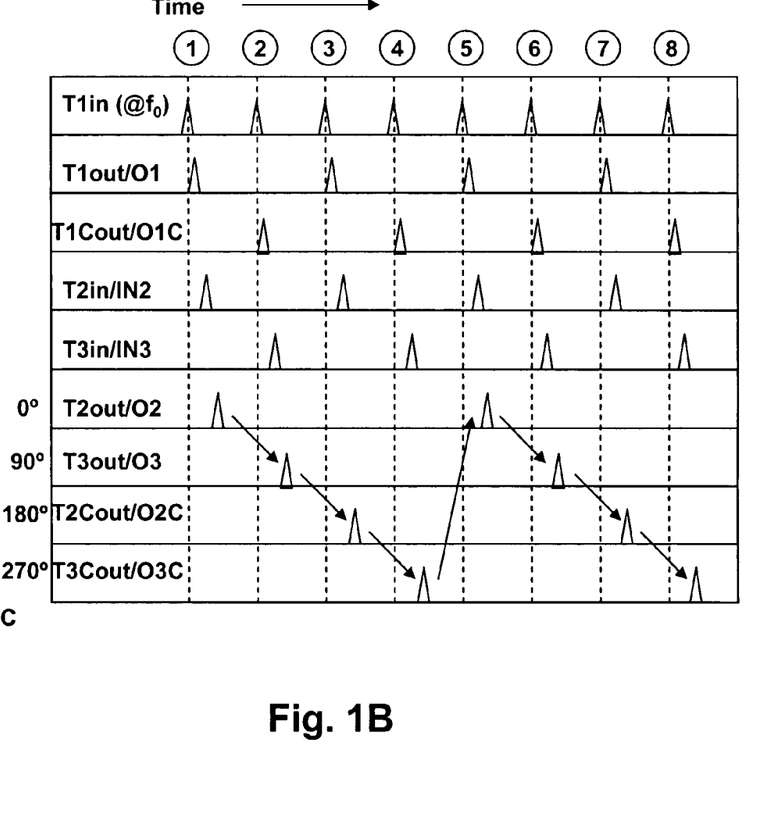
FIGS. 1B and 1C are sample timing diagram of pulse signals produced by the circuit of FIG. 1A, with FIG. 1C illustrating the generation and propagation of error pulses.
Figure 1C:
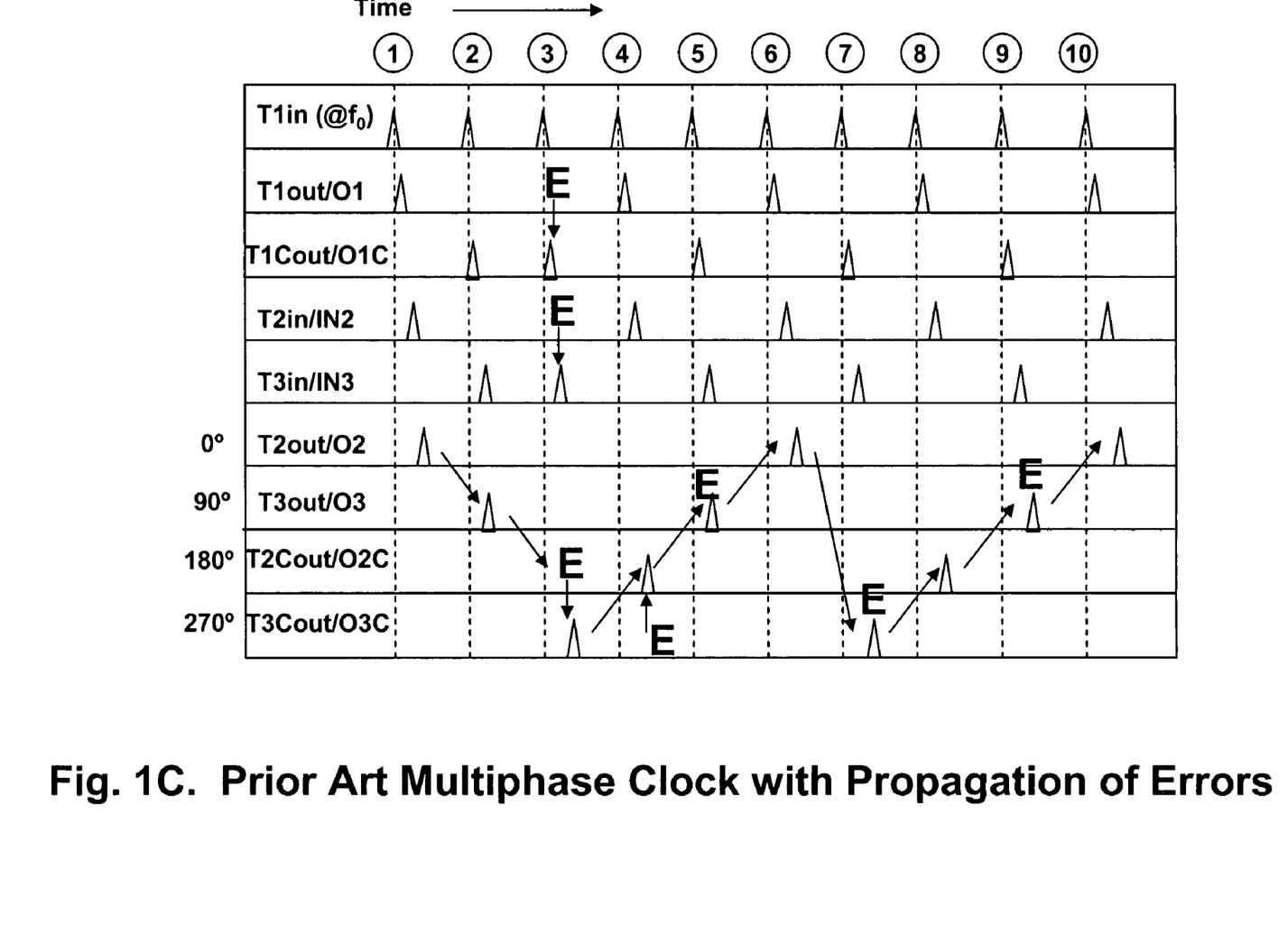

There is a subtle, but significant, problem/limitation associated with the circuit of the type shown in FIG. 1A which will be explained with reference to the detailed timing diagrams of FIGS. 1B and 1C.

The prior art circuit of FIG. 1A makes use of TFFCs which may be implemented using superconducting circuits which produce pulses (rather than voltage levels) at their outputs. The operation of a multiphase clock employing such TFFCs is illustrated in FIG. 1B. Assume a master clock source 11 produces a stream of pulses $f_0$ into the input T1in (IN1) of TFFC T1, each pulse is directed alternately to the primary output T1out (O1) or to the complementary output T1Cout (O1C) (indicated in FIG. 1A by the small circle next to the output). The TFFC is an asynchronous element with a bistable internal latch that keeps track of the device history. A single TFFC may function as a two-phase clock, wherein a master clock source at $f_0$ is split into two phase-coherent sources at $f_0/2$, each 180 degrees out of phase with the other. If the outputs of this TFFC (e.g., T1) are directed to the inputs (e.g., IN2, IN3) of two other TFFCs (e.g., T2, T3), each of these (T2, T3) will produce another clock source at the rate of $f_0/4$ at their respective outputs (e.g., O2, O2C, O3, O3C). These four outputs are phased at 0, 90, 180, and 270 degrees relative to one another.

The circuit of FIG. 1A is generally a highly reliable circuit; generating errors at a level which may typically be less than one part in a trillion ($10^{12}$). However, although rare, an error may arise, such that an output pulse is directed to the "wrong" output, as indicated by the E in FIG. 1C. While the individual error events may be rare, in fast clocked systems, they dramatically limit the long-term proper functioning of the devices.

The nature of the problem with the circuit of FIG. 1A may be explained with reference to FIG. 1C which illustrates what happens when an error pulse occurs; e.g., a pulse that should have been directed to T1out is directed instead to T1Cout. Following the occurrence of the error, T1 directs its input pulses to alternating outputs, as it should. However, T1 continues to operate out of phase and supplies the out-of-phase signals to T2 and T3. The out-of-phase error is maintained within the system and does not reset to its initial phasal relationship. In the absence of an error pulse, the phasal relationships are defined as follows: the phase of T2out is at 0 degrees, T2Cout is 180 degrees, T3out is 90 degrees, and T3Cout is 270 degrees. After the occurrence of the error pulse, T2out still defines the 0 degrees phase and T2Cout is still 180 degrees, but T3out now corresponds to a phase which is displaced 270 degrees, and T3Cout now corresponds to a phase which is displaced 90 degrees from T2out. Two of the clock phases have switched and they subsequently remain switched, at least until another error occurs. In many applications of multiphase clocks, where the relative phases are critical, this results is a significant error.

Figure 6:
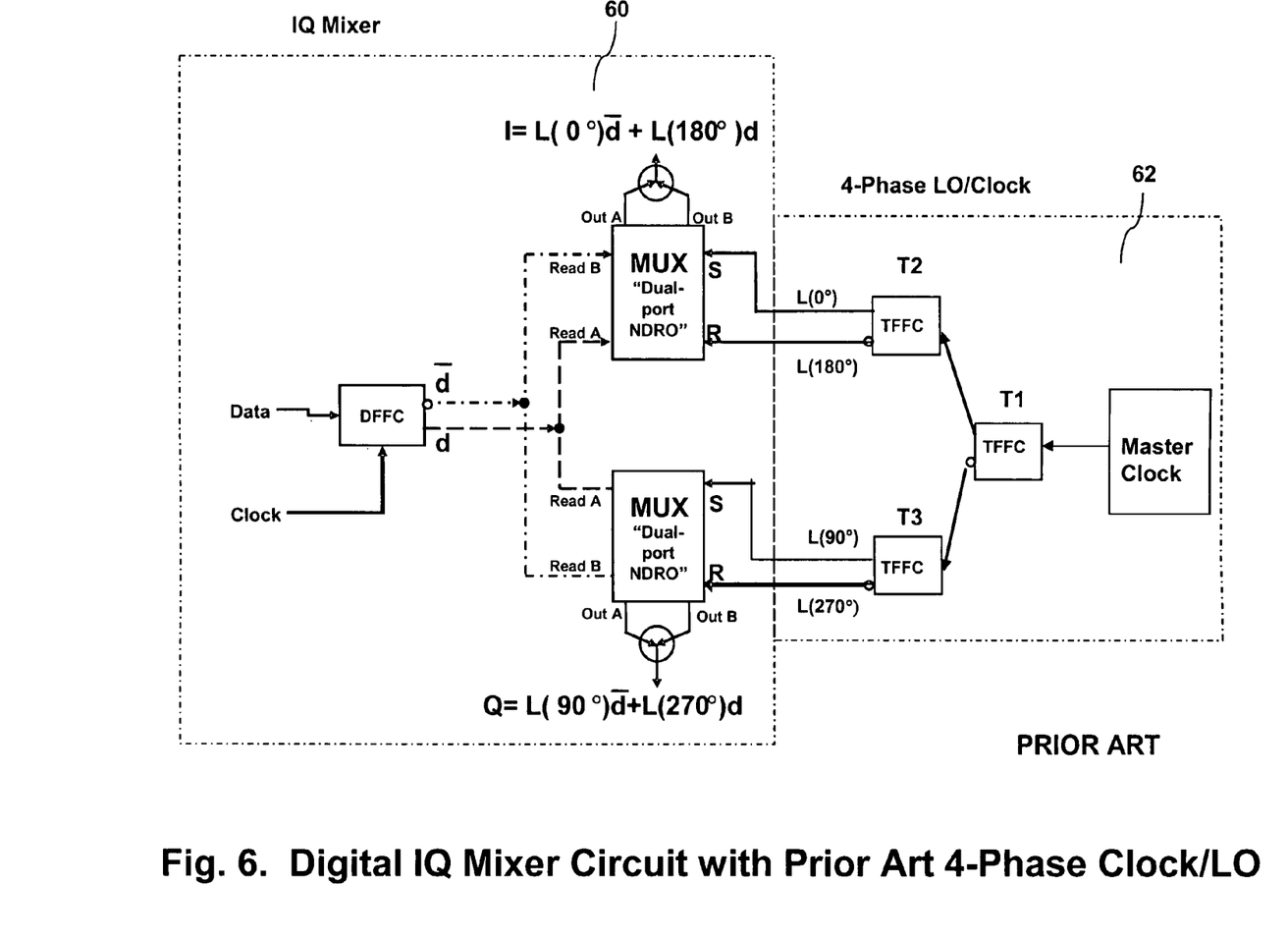
FIG. 6 is a block diagram of a prior art digital IQ mixer circuit with a 4-phase clock local oscillator (LO)

The significance of the phasal-inversion errors discussed above was not recognized and understood. In fact, as shown in FIG. 6 and discussed below, the multiphase clock circuit of FIG. 1A was used as part of a digital local oscillator 60 in a digital IQ (in-phase and quadrature) mixer circuit in a digital radio receiver system. The FIG. 6 circuit demonstrated proper functionality in detailed simulation and low-speed testing. However, at high-speed operation, phase errors were generated, but the basis for such errors was not apparent. Only a careful re-analysis of error sources identified the problem. For example, if the master clock operates at $f_0=10$ GHz (a typical value for high-speed RSFQ systems), then for a bit-error-rate of $10^{-12}$, an inversion error of this sort occurs once every 100 seconds. This is clearly unacceptable for proper long-term operation of the multiphase clock circuit.

Accordingly, Applicant's invention resides, in part, in the recognition that a multiphase clock circuit which allows for the propagation and regeneration or recirculation of error signals (uncorrected phasal switching) gives rise to potentially severe problems.

The erroneous operation present in the prior art circuit is not present in circuits embodying the invention which includes an improved (RSFQ) multiphase clock circuit which recovers automatically from rare bit errors, and also operates at high frequency with high clock precision.

SUMMARY OF THE INVENTION

Circuits embodying the invention include a multiphase clock circuit in which bit errors are propagated only for the duration of the clock cycle in which they occur and are not regenerated within the circuit. The circuit recovers automatically from bit errors and is capable of operating at high frequency with high clock precision.

In accordance with the invention, a multiphase clock circuit for generating N clock signals of the same base frequency but different phases includes a master clock producing a master clock signal of frequency fc which is applied to a divide by N frequency divider circuit for producing a base clock signal of fc/N. The base clock signal is sequentially applied to the data inputs of a series chain of N clocked data flip-flops (DFFs) each of which is concurrently clocked by a clock signal of frequency fc to produce N clock signals separated from each other by a period T, where T is equal to 1/fc.

In a particular embodiment, a decimated clock pulse (of frequency fc/N) enters the first DFF, and is sequentially clocked out from each DFF at the higher master clock rate of fc. Because the DFFs are destructive memory cells that are reset every period, they retain no memory and hence rare errors are clocked out during each clock cycle; they do not accumulate or re-circulate.

Circuits embodying the invention may be implemented using superconducting Josephson Junctions (JJs) interconnected to form rapid single flux quantum (RSFQ) circuits whose operations are based on the distribution of quantized data pulses, where each single-flux-quantum (SFQ) pulse has a peak height of order 1 millivolt (mV) and a pulse width of the order of 2 picoseconds (ps) such that the time-integrated pulse is precisely equal to 2.07 mV–ps=h/2e=$\Phi_0$, the fundamental magnetic flux quantum.

The multiphase clock signals may be applied to a digital I-Q mixer circuit, leading to improved long-term performance.

The multiphase clock signals may also be applied to other RSFQ circuits that require multiphase clocks, such as serializers and de-serializers, and interleaved analog-to-digital converters

BRIEF DESCRIPTION OF THE DRAWINGS

In the accompanying drawings like reference characters denote like components.

FIGS. 2B1 and 2B2 are schematic diagrams of the logic "0" and "1" states of a data flip flop (DFF) suitable for use in practicing the invention;

DETAILED DESCRIPTION OF THE INVENTION

Figure 2:
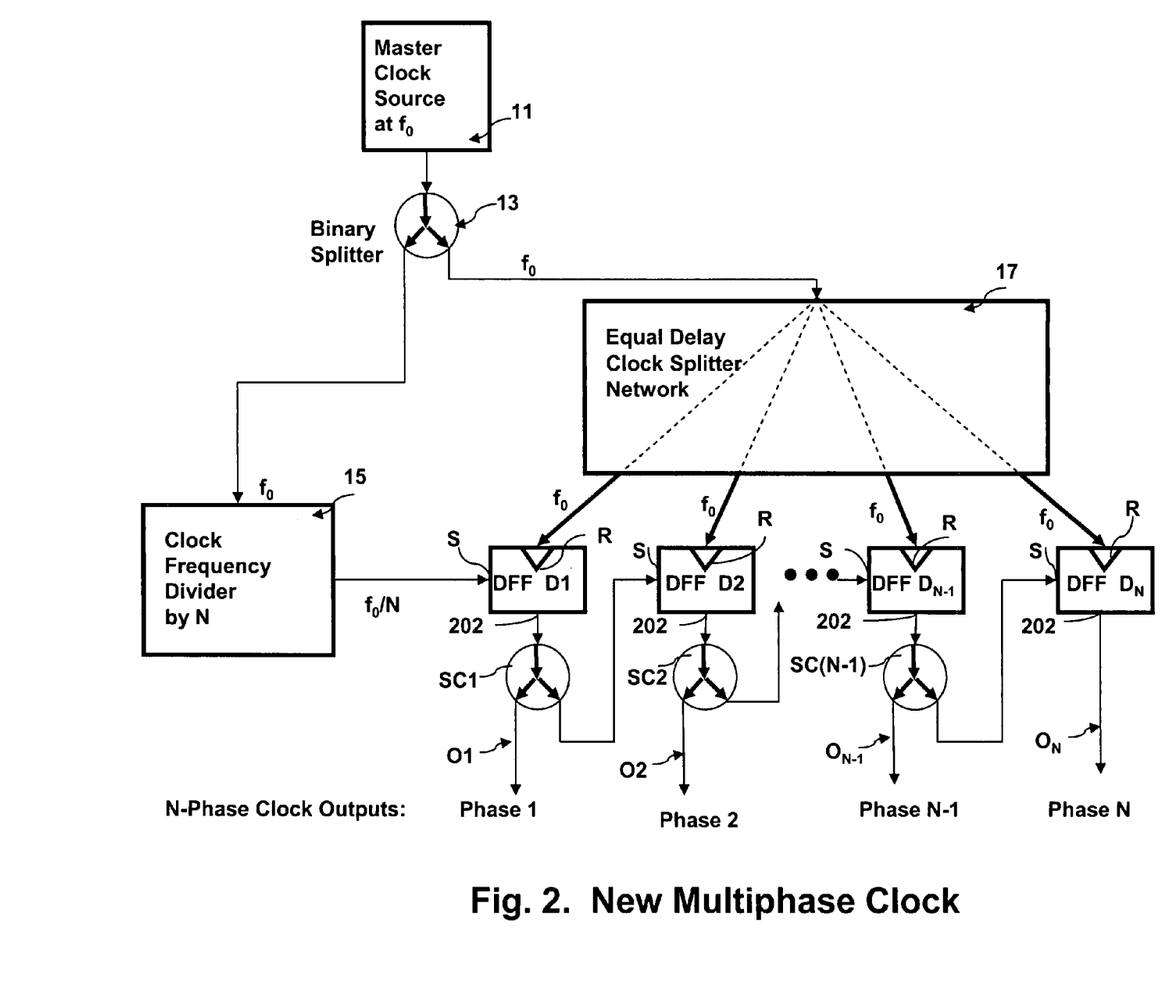
FIG. 2 is a block diagram of a multiphase clock circuit embodying the invention.

FIG. 2 is a block diagram of a multiphase clock circuit embodying the invention. A master clock 11 generates a master frequency clock signal fc=$f_o$. The master clock signal is distributed via a binary splitter 13 to a divide by N circuit 15 and a precision clock distribution network 17. The circuit makes use of a chain of clocked data flip-flops (DFFs), together with the master clock frequency divider 15 and the precision clock distribution network 17. The output from the frequency divider, which may be considered a decimated clock pulse, is fed to the data input of the first DFF (DFF D1) of the serial chain of DFFs. The data input is sequentially clocked out from each DFF at the higher master clock rate of fc=$f_o$. Because the DFFs are destructive memory cells that are reset every period, they retain no memory and hence rare errors do not accumulate and/or recirculate.

The heart of the FIG. 2 circuit includes the series chain of N data flip flops or DFFs which are clocked at a rate of $f_0$. The input to the first flip-flop D1 is derived from a frequency divider network 15. The data output (Oi) of each flip flop is then fed to the data input [IN(i+1)] of the next succeeding flip-flop (i.e., O1 to IN2, O2 to IN3, O(N−1) to IN(N). As noted above, the circuit includes a master clock source 11 which produces a stream of pulses $f_0$ applied to a binary splitter 13 for generating a like stream of pulses $f_0$ applied, in parallel, to a frequency divider 15 and an equal delay clock splitter network 17. The frequency divider circuit 15 may be any divide by N circuit, where N is any integer greater than 1.

For purpose of illustration, the operation of the circuit of FIG. 2 will be described for the case where N is equal to four (4). The clock signal $f_0$ is applied to an equal delay splitter network 17 which functions to produce N corresponding $f_0$ clock signals which are applied, in parallel, to the reset inputs (R) of the DFFs of the chain with correct timing and/or delays to maintain synchronism. Thus, the divider network 15 generates a data input signal (which may also be termed a "base" clock signal) at a frequency of $f_0$/N, while the equal-delay clock splitter network 17 distributes the master clock $f_0$ to each of the N DFFs at predetermined times. The outputs of the DFFs are applied to splitter cells (SCi) which function as binary splitters with two output branches, one branch supplying signals/pulses to an output point and the other branch supplying input pulses to the next DFF along the chain.

Figures 2B, 2B, 2B:
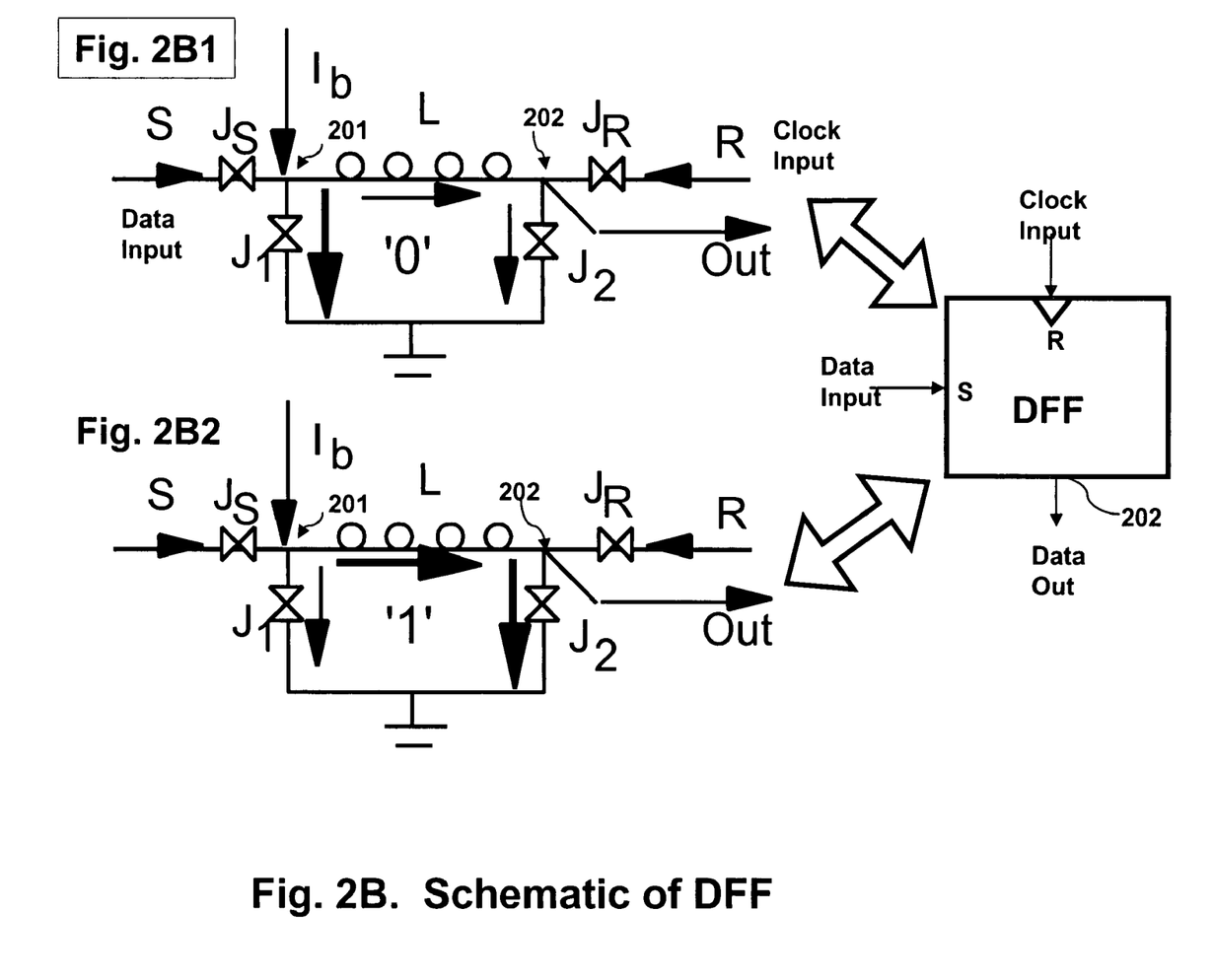

Description of DFF for Multiphase Clock Patent Application (FIGS. 2B1 and 2B2)

Each DFF, represented in block form in FIGS. 2 and 2B, may be settable to a "0" logic state or to "1" logic state as shown schematically in FIGS. 2B1 and 2B2, respectively. The data-flip-flops (DFFs) used to practice the invention may be a standard cell in RSFQ technology, as shown schematically in FIGS. 2B1 and 2B2. This is essentially the same as a Set-Reset Flip-flop (RSFF) and a Destructive Readout (DRO) cell. Each DFF has a data input port which may also be identified as the "set" (S) input; a clock input port which may also be identified as the "reset" (R) input, and an output port, 202, which may also be identified as the data output (Data Out). Each flip-flop includes a loop containing Josephson junctions $J_1$, $J_2$, and an inductor L to form a SQUID (superconducting quantum interference device). A DC bias current $I_b$, supplied to a junction 201, is less than the critical current, $I_c$, of the SQUID, so the junctions (J1, J2) remain in the superconducting state. Data and Clock pulses are single-fluxquantum (SFQ) pulses, narrow voltage pulses with pulse width of order 2 picoseconds (ps) and pulse height of order 1 mV, such that the time-integral of the SFQ pulse is equal to the fundamental magnetic flux quantum $\Phi_0 = h/2e = 2.07$ mV–ps=2.07 mA–pH.

When the bias current is initially applied, it is automatically distributed through the SQUID in such a way that most of the current passes through junction $J_1$, so that it is biased close to its critical current, as suggested in FIG. 2B1. This corresponds to the '0' state of the internal latch (top diagram). When a clock pulse enters the Reset (R) input, if the SQUID is in the '0' state, junction J2 draws most of the current provided by the clock pulse. But this is not sufficient to raise the current through J2 above its critical current and the output remains low; i.e., no pulse is produced. When a data input pulse enters the Set input, it causes J1 to briefly exceed its critical current, in turn causing the bias current to redistribute through the inductor L and junction J2 to produce the condition shown in FIG. 2B2. Since J1 and J2 are now in the superconducting state, this configuration is stable, and corresponds to the '1' state of the latch. One can also view this as a dynamic SFQ input pulse leading to storage of flux $\Phi_0$ in the loop, with a circulating current through L. When a clock pulse enters the Reset (R) input, if the SQUID is in the '1' state, junction J2 now briefly exceeds its critical current, generating a voltage pulse on the output and causing the bias current to redistribute back to the initial condition shown in FIG. 2B1. One can also view this as releasing the stored $\Phi_0$ and turning it back into a dynamic SFQ output voltage pulse. Junctions $J_S$ and $J_R$ are buffer junctions that prevent backward propagation of SFQ pulses on input lines.

The DFF functions such that a data bit applied to the data input of the DFF is stored in an internal latch until it is released by a clock pulse, whereby an SFQ pulse is released on the output and the latch is reset. This is also sometimes known as a destructive readout (DRO) cell. The operation of a series chain of DFFs to generate a 4-phase clock is illustrated in the timing diagram of FIG. 3. Upon release of the output pulse from the first DFF, D1, the pulse is duplicated by a standard binary splitter, with one of the outputs representing a phased clock output, and the other passed to the next DFF in series.

Figure 3:
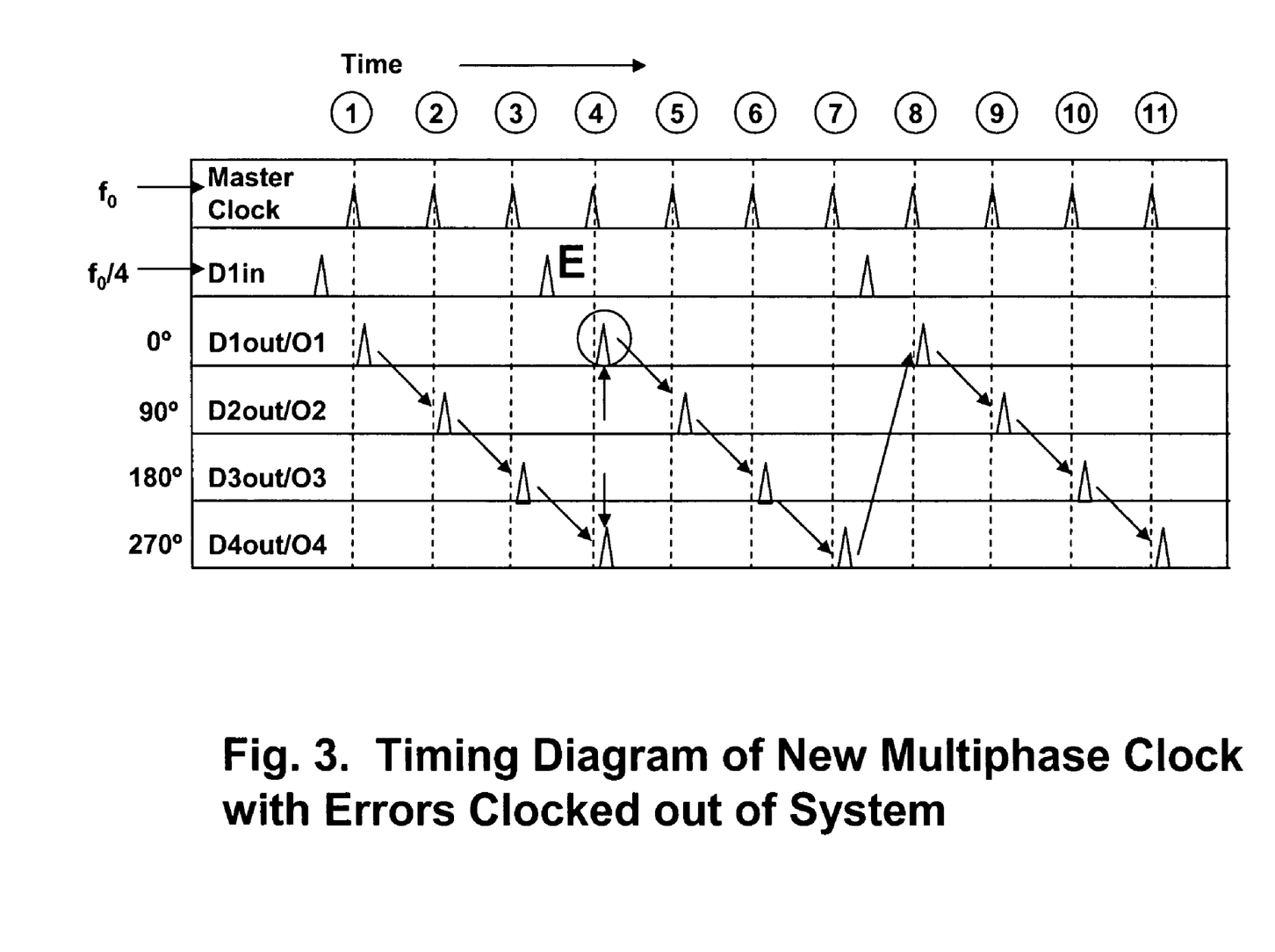
FIG. 3 is timing diagram of pulse signals produced by the circuit of FIG. 2.

FIG. 3 demonstrates the timing of the circuit of FIG. 2 configured to produce a 4-phase clock for: (a) error free operation; and (b) for the condition when an error signal is introduced. When no error is present the flip-flops produce their outputs sequentially along the chain of flips-flops.

An error condition may occur as follows; For purpose of illustration, assume that the digital frequency divider 15 generates an error pulse, e.g., a premature pulse, as identified by the letter E in FIG. 3. During the following master clock cycle, flip-flops D1 and D4 generate output signals at the same time, a clear error. However, after this error, the relative phases of all 4 DFFs continue to be correct. This is in contrast to the operation of the prior art multiphase clock shown in FIG. 1. The circuit of FIG. 2 will propagate errors only during the particular clock periods in which an error is generated. The errors will not accumulate and/or remain in the counting loop. This is because the DFFs are designed to be reset each clock period, with no memory beyond that time. For very rare errors, such isolated events can easily be tolerated.

Figure 5:
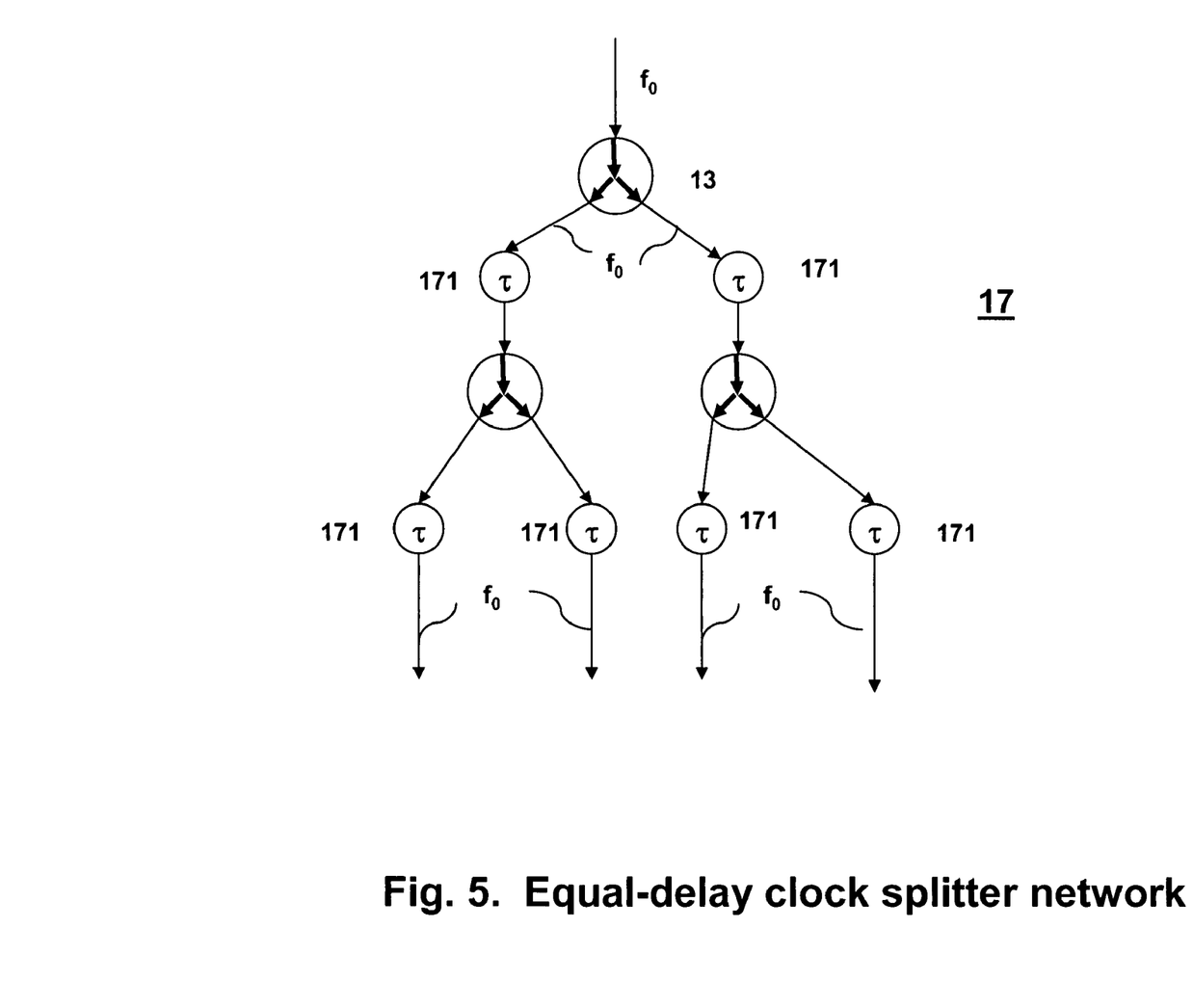
FIG. 5 is a simplified block diagram of an equal delay clock network suitable for use in practicing the invention.

As the timing diagram of FIG. 3 demonstrates, the delay between the outputs of each DFF is determined by the master clock inputs. This is why proper operation at high frequencies requires that the clock inputs of the various DFFs be synchronized. This is accomplished by an equal-delay clock splitter network 17. One example of such a circuit is a binary tree of binary splitters with balanced delay elements 171 in each arm, as shown in FIG. 5.

Figure 4A:
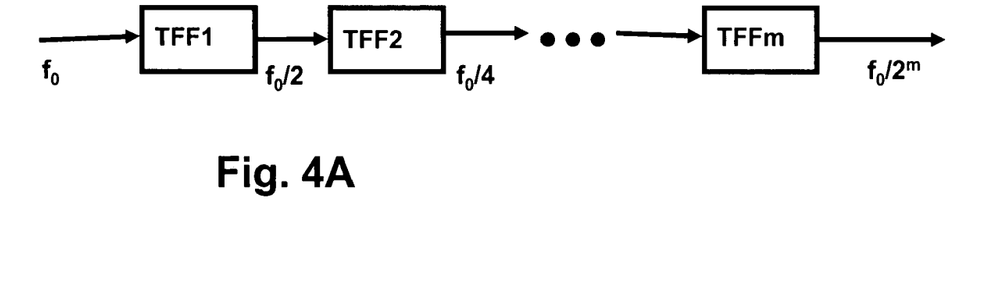
FIGS. 4A and 4B are block diagrams of frequency divider circuits suitable for use in practicing the invention.
Figure 4B:
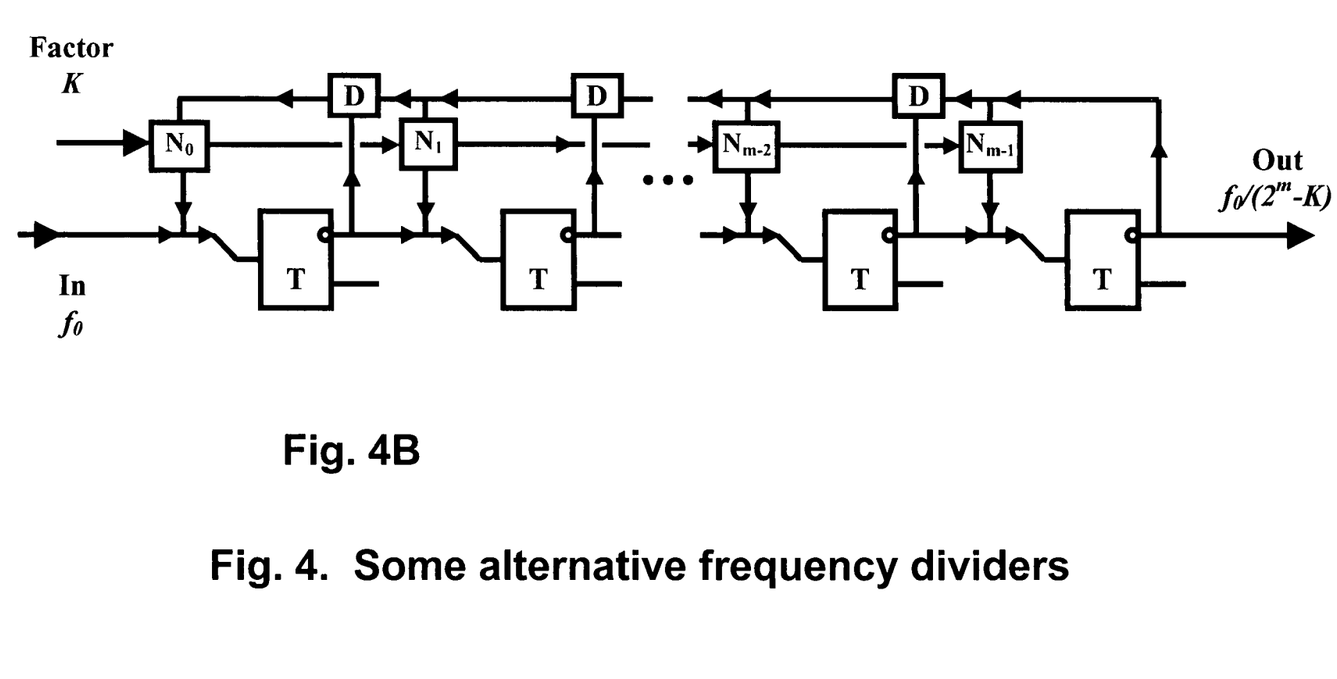

A key component of the multiphase clock is a frequency divider 15. The frequency divider may be implemented by means of a series chain of TFFs as shown in FIG. 4A; which is a standard prior art frequency divider comprising m toggle-flip-flops (TFF), which divides the incoming frequency by a factor of $2^m$, i.e., by a power of 2. Alternatively, the frequency divider may be implemented by a circuit which divides by a factor other than a power of 2, as shown in prior art FIG. 4B disclosed in U.S. patent application Ser. No. 11/943,798, publication No. 20090186064, where the divider ratio N may be selected under program control.

FIG. 6 shows a digital IQ mixer circuit in RSFQ technology, for application to a digital receiver system, as described in more detail in U.S. patent application Ser. No. 11/243,019, publication No. 20070077906. The IQ mixer circuit 60 is operated and manipulated by means of a prior art 4-phase clock 62. The 4-phase clock functions as a local oscillator (LO) generation circuit, with two phases that are shifted by 90 degrees. Each of the two I and Q mixer circuits (top and bottom) carries out 1-bit digital multiplication between the input data stream and the LO. This mixer circuit (based on a multiplexer or dual-port non-destructive readout cell) also requires the complementary signals of both the data and the LO output, so that here all 4 phases of the LO are required. This is equivalent to requiring a 4-phase clock, and it should be clear that the relative phases of these clock signals are critical for proper operation of the entire circuit. As discussed above, for the prior art circuit, when a bit error occurs, even though the error is very rare, a response to the bit error results in a recurrent phasal error which is repetitive and regenerative and continues to be present in the circuit until an external reset is applied or until another error canceling the original error occurs. For such a condition, the operation of the circuit is compromised, even though the bit error associated with the clock and or associated circuitry is a very rare occurrence.

Figure 7:
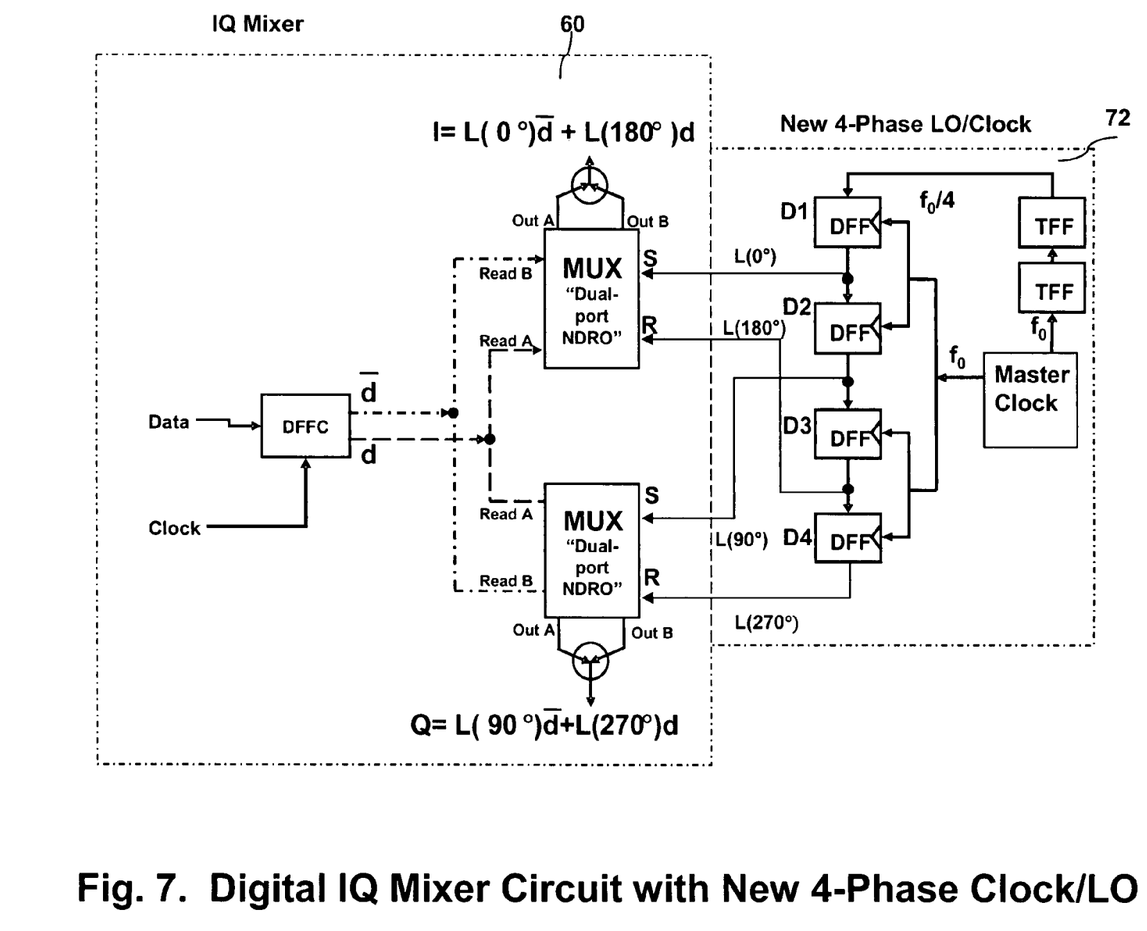
FIG. 7 is a block diagram of a digital IQ mixer circuit combined with a 4-phase clock local oscillator (LO) embodying the invention.

FIG. 7 illustrates the application of a 4-phase clock 72, embodying the invention, for controlling the operation of an IQ mixer 60. Note that in practice clock 72 may be built to include the various splitters and delay networks shown in FIGS. 2 and 5 to ensure that the pulse production is appropriately synchronized. An integrated circuit with the clock circuit 72 was fabricated and tested, and found to work properly at high speeds, without the accumulated errors that caused the malfunction of the mixer circuits formed with the multiphase circuit of FIG. 1A.

The multiphase clock embodying the invention is shown in FIG. 7 to be applied to a digital I-Q mixer circuit, leading to improved long-term performance. It may also be applied to other RSFQ circuits that require multiphase clocks, such as serializers and de-serializers, and interleaved analog-to-digital converters, as shown in FIG. 8.

Figure 8:
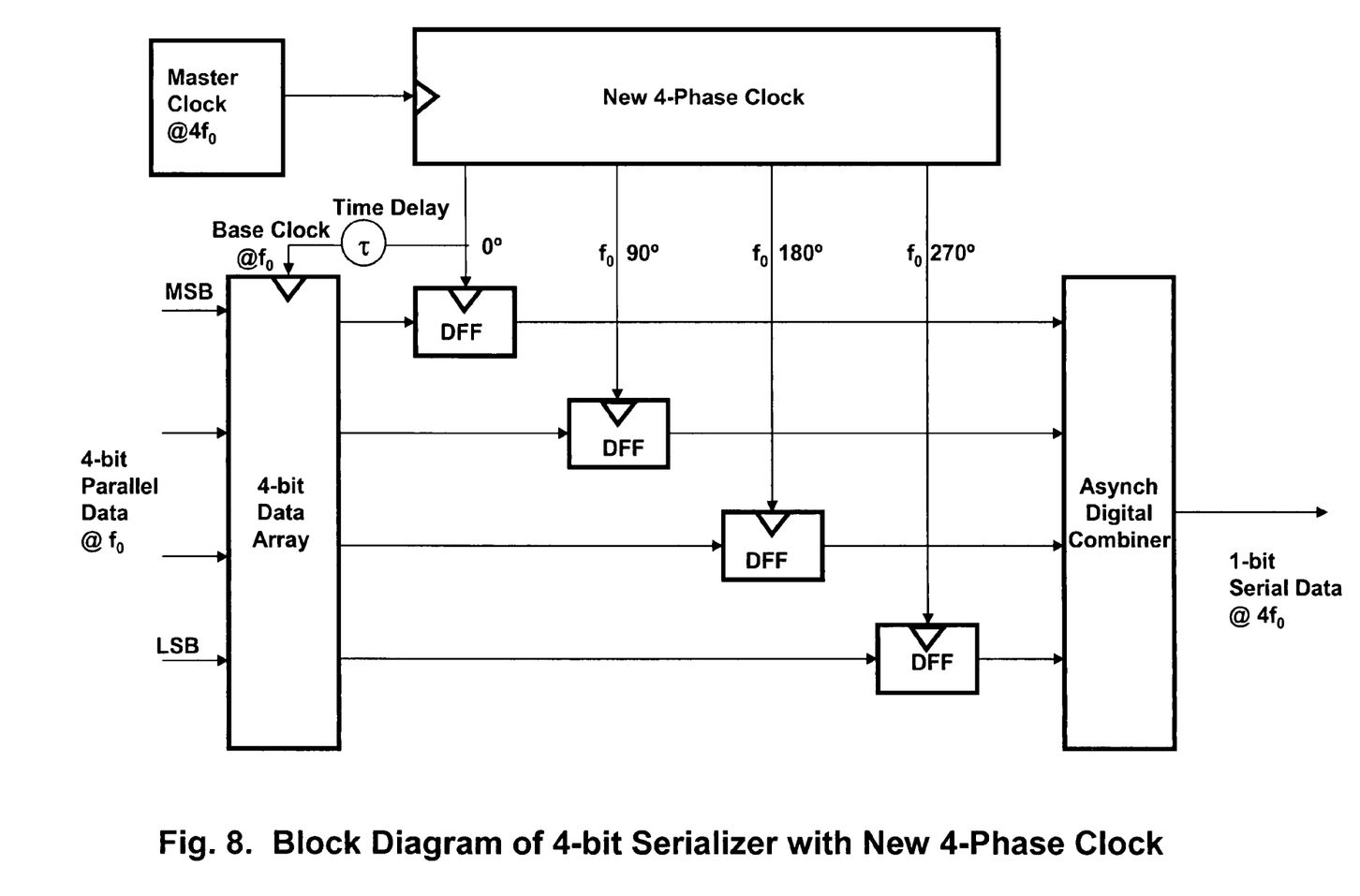
FIG. 8 is a block diagram of a 4-bit serializer operated with a 4-phase clock embodying the invention.

FIG. 8 is an example of another application of a multiphase clock embodying the invention for serialization of a set of N parallel data streams into a single data stream at a rate that is N times larger. This may be implemented using an N-phase clock, where maintaining the relative phases of the clocks is essential for proper encoding of the serial data stream. A similar N-phase clock is also essential to deserialize the data at the other end. Accumulated phase errors of the sort that may occur in the prior-art multiphase clock would be fatal to proper long-term operation of such serializers and deserializers.

Thus, the multiphase clock of the invention, is superior to the prior art type which was susceptible to accumulation (regeneration and recirculation) of errors from rare bit-error events. The novel design proposed herein is largely immune from error accumulation of this type and is highly suitable for application to a high-speed RSFQ digital mixer circuit and like circuits. Of significance is that any error introduced in a multiphase network embodying the invention will be clocked out or removed within one full cycle of the multi-phase clock.

What is claimed is:

1. A multiphase clock circuit comprising:
   a master clock signal of frequency fc;
   a divide by N frequency divider circuit having an input and an output;
   where N is any integer greater than one (1);
   means applying the master clock signal to the input of the divide by N circuit for producing a base clock signal of frequency fc/N at its output;
   a series chain of N clocked data flip-flops (DFFs), each one of said DFFs having a data input port, a data output port and a clock input port; and said DFFs being interconnected in an ordered sequence with the output of the divide by N circuit being coupled to the data input port of the first DFF of the chain and the data output port of each succeeding flip flop, except for the last, being connected to the data input port of a succeeding flip-flop;
   wherein the flip-flops and the divide by N circuit are formed using superconducting Josephson Junctions (JJs) interconnected to form rapid single flux quantum (RSFQ) circuits whose operations are based on the distribution of quantized data pulses, where each single-flux-quantum (SFQ) pulse has a peak height on the order of 1 millivolt (mV) and a pulse width on the order of 2 picoseconds (ps) such that the time-integrated pulse is precisely equal to 2.07 mV–ps=h/2e=$\Phi_0$, the fundamental magnetic flux quantum; and
   means responsive to the master clock signal for concurrently applying a clock signal of frequency fc to the clock input port of all the DFFs for producing N sequentially and equally spaced clocked signals, each of frequency fc/N.

2. A multiphase clock circuit as claimed in claim 1 wherein the master clock is distributed to the clock input port of the DFFs via an equal delay clock splitting network.

3. A multiphase clock circuit as claimed in claim 2, wherein the output port of each DFF is connected to the input port of a next succeeding flip-flop via a splitter network.

4. A multiphase clock circuit as claimed in claim 1 wherein N is equal to 4.

5. A multiphase clock circuit as claimed in claim 1 wherein said divider circuit includes means for dividing the frequency by any selected number greater than 1.

6. A multiphase circuit as claimed in claim 1 wherein, as to each DFF, its data input port functions as a set input, its clock input port functions as a reset input and wherein, when the DFF is set to a logic "one" condition and a clock signal is applied, the DFF produces a pulse at its data output with concurrent resetting to the logic "zero" condition.

7. A multiphase circuit as claimed in claim 1 wherein N is equal to 4 for producing a 4-phase clock signal useable as a 4-phase local oscillator for connection to and use with a mixer circuit.

8. A multiphase circuit as claimed in claim 1 wherein N is equal to 4 for producing a 4-phase clock signal useable to convert a set of parallel data bits of frequency fc/4 into a serial stream of frequency fc.

9. A multiphase circuit as claimed in claim 1 wherein the N DFFs produce N clock signals useable to convert a set of N parallel data bits into a serial stream of data bits.

10. A multiphase circuit as claimed in claim 1 wherein N is equal to 4 for producing a 4-phase local oscillator clock; one phase being the zero degree clock signal, the second phase being the ninety degree clock signal, the third phase being the one hundred and eighty degree clock signal, and the fourth phase being the two hundred and seventy degree clock signal; and further including a mixer circuit having an in-phase section and a quadrature section; and wherein the first and third phases are applied to the in-phase sections of the mixer and the second and fourth phases are applied to the quadrature section of the mixer.

11. A multiphase circuit as claimed in claim 1 wherein, as to each DFF, its data input port functions as a set input, its clock input port functions as a reset input and wherein, when the DFF is set to a logic "one" condition and a clock signal is applied, the DFF produces a pulse at its data output with concurrent resetting to the logic "zero" condition.

12. A multiphase circuit as claimed in claim 1 wherein N is equal to 4 for producing a 4-phase clock signal useable as a 4-phase local oscillator for connection to and use with a mixer circuit.

13. A multiphase circuit as claimed in claim 1 wherein N is equal to 4 for producing a 4-phase clock signal useable to convert a set of parallel data bits of frequency fc/4 into a serial stream of frequency fc.

14. A multiphase circuit as claimed in claim 1 wherein the N DFFs produce N clock signals useable to convert a set of N parallel data bits into a serial stream of data bits.

15. A multiphase circuit as claimed in claim 1 wherein N is equal to 4 for producing a 4-phase local oscillator clock; one phase being the zero degree clock signal, the second phase being the ninety degree clock signal, the third phase being the one hundred and eighty degree clock signal, and the fourth phase being the two hundred and seventy degree clock signal; and further including a mixer circuit having an in-phase section and a quadrature section; and wherein the first and third phases are applied to the in-phase sections of the mixer and the second and fourth phases are applied to the quadrature section of the mixer.

16. A multiphase clock circuit comprising:
   a master clock terminal for the application thereto of a master clock signal of frequency fc;
   a divide by N frequency divider circuit having an input and an output;
   where N is any integer greater than one (1);
   means applying the master clock signal to the input of the divide by N circuit for producing a base clock signal of frequency fc/N at its output;
   a series chain of N clocked data flip-flops (DFFs), each one of said DFFs having a data input port, a data output port and a clock input port; and said DFFs being interconnected in an ordered sequence with the output of the divide by N circuit being coupled to the data input port of the first DFF of the chain and the data output port of each succeeding flip flop, except for the last, being connected to the data input port of a succeeding flip-flop; and
   a delay network connected between the master clock terminal and the clock input port of each one of the DFFs for concurrently applying synchronized clock signals of frequency fc to the clock input port of all the DFFs and ensuring that the clock signals at the clock input ports are equally delayed for producing N sequentially and equally spaced clocked signals, each of frequency fc/N.

17. A multiphase clock circuit as claimed in claim 16 wherein the delay network includes an equal delay clock splitting network.

18. A multiphase clock circuit as claimed in claim 16, wherein the output port of each DFF is connected to the input port of a next succeeding flip-flop via a splitter network.

19. A multiphase clock circuit as claimed in claim 16 wherein the flip-flops and the divide by N circuit are formed using superconducting Josephson Junctions (JJs) interconnected to form rapid single flux quantum (RSFQ) circuits whose operations are based on the distribution of quantized data pulses, where each single-flux-quantum (SFQ) pulse has a peak height on the order of 1 millivolt (mV) and a pulse width on the order of 2 picoseconds (ps) such that the time-integrated pulse is precisely equal to 2.07 mV–ps=h/2e=$\Phi_0$, the fundamental magnetic flux quantum.

20. A multiphase clock circuit as claimed in claim 19 wherein N is equal to 4.

21. A multiphase clock circuit as claimed in claim 19 wherein said divider circuit includes means for dividing the frequency by any selected number greater than 1.

* * * * *